| US010636725B2

United States Patent
Van Dan Elzen et al.

(10) Patent No.: US 10,636,725 B2
(45) Date of Patent: Apr. 28, 2020

(54) ELECTRICAL MODULE COOLING THROUGH WASTE HEAT RECOVERY

(71) Applicant: VEONEER US INC., Southfield, MI (US)

(72) Inventors: Christopher Louis Van Dan Elzen, Rochester, MI (US); Oliver Kretzer, Bietigheim-Bissingen (DE); Ralf Kissling, Novi, MI (US)

(73) Assignee: VEONEER US INC., Southfield, MI (US)

( * ) Notice: Subject to any disclaimer, the term of this patent is extended or adjusted under 35 U.S.C. 154(b) by 0 days.

(21) Appl. No.: 15/846,999

(22) Filed: Dec. 19, 2017

(65) Prior Publication Data

US 2019/0189535 A1 Jun. 20, 2019

(51) Int. Cl.
*H01L 23/38* (2006.01)
*H01L 35/32* (2006.01)
(Continued)

(52) U.S. Cl.
CPC .............. *H01L 23/38* (2013.01); *H01L 35/30* (2013.01); *H01L 35/32* (2013.01); *H05K 7/2089* (2013.01); *H01L 2225/06589* (2013.01)

(58) Field of Classification Search
CPC ....... G06F 1/181–182; H05K 7/20218–20381; H05K 7/20409–20418; H05K 7/20009–202; H01L 23/367–3677; H01L 23/473; H01L 23/46–467; H01L 23/38; H01L 35/30; H01L 35/32; H01L 2225/06589
USPC ...... 361/676–678, 679.46–679.54, 688–723, 361/699–704, 709–710, 719–721; 165/80.1–80.5, 104.33, 185; 174/15.1–15.3, 16.1–16.3, 547, 548;
(Continued)

(56) References Cited

U.S. PATENT DOCUMENTS 7,301,233 B2 11/2007 Lee et al. ............... 257/719
7,924,569 B2 * 4/2011 Letz ................ H01L 25/0657
136/201

(Continued)

FOREIGN PATENT DOCUMENTS

WO WO 2016/025985 2/2016 ............ F28D 20/00

OTHER PUBLICATIONS

Orr, B., et al., "A review of car waste heat recovery systems utilising thermoelectric generators and heat pipes", Applied Thermal Engineering 101 (2016), pp. 490-495.
(Continued)

*Primary Examiner* — Jayprakash N Gandhi
*Assistant Examiner* — Razmeen Gafur
(74) *Attorney, Agent, or Firm* — Christopher P. Maiorana, PC

(57) ABSTRACT

An apparatus includes a base, one or more first fins, one or more second fins and one or more thermoelectric generation units. The base may be thermally couplable to an electrical module that generates heat while operational. The first fins may be thermally connected to the base. The second fins may be thermally isolated from the base. The thermoelectric generation units may be (i) disposed between the first fins and the second fins and (ii) configured to convert a heat difference between the first fins and the second fins into an electrical signal at a port thereby cooling the electrical module.

20 Claims, 8 Drawing Sheets

(51) Int. Cl.
*H01L 35/30* (2006.01)
*H05K 7/20* (2006.01)

(58) Field of Classification Search
USPC ... 257/712–722, E23.088; 24/453, 458–459; 454/184; 312/236
See application file for complete search history.

(56) References Cited

U.S. PATENT DOCUMENTS

| | | | |
|---|---|---|---|
| 7,954,332 B2 | 6/2011 | Orlowski | 62/3.7 |
| 8,325,478 B2* | 12/2012 | Siracki | H05K 7/20163 361/678 |
| 8,618,406 B1* | 12/2013 | Bilak | H01L 35/30 136/200 |
| 8,649,179 B2* | 2/2014 | Hershberger | H05K 1/0203 136/204 |
| 8,997,502 B2* | 4/2015 | Ayres | F25B 21/02 62/3.2 |
| 2005/0207115 A1* | 9/2005 | Barsun | G06F 1/20 361/690 |
| 2006/0001140 A1 | 1/2006 | Lee et al. | 257/686 |
| 2007/0095379 A1* | 5/2007 | Taher | H01L 35/30 136/205 |
| 2007/0211438 A1* | 9/2007 | Foster, Sr. | G06F 1/184 361/721 |
| 2008/0089034 A1* | 4/2008 | Hoss | G06F 1/20 361/721 |
| 2008/0229759 A1 | 9/2008 | Ouyang et al. | 62/3.3 |
| 2010/0024859 A1* | 2/2010 | Bell | F01N 5/025 136/201 |
| 2010/0079959 A1 | 4/2010 | Letz | 361/717 |
| 2010/0134983 A1* | 6/2010 | Rechenberg | H01G 2/08 361/715 |
| 2012/0038175 A1 | 2/2012 | Tang et al. | 290/1 R |
| 2012/0181859 A1 | 7/2012 | Nagy et al. | 307/9.1 |
| 2013/0186448 A1* | 7/2013 | Ranalli | F01N 5/025 136/204 |
| 2013/0192270 A1* | 8/2013 | Ludwig | F25B 21/04 62/3.2 |
| 2013/0285686 A1* | 10/2013 | Malik | G01R 31/2875 324/750.05 |
| 2014/0202178 A1* | 7/2014 | Trumbower | B60L 11/1874 62/62 |
| 2014/0208773 A1* | 7/2014 | Schroeder | H01L 35/00 62/3.3 |
| 2014/0260367 A1* | 9/2014 | Coutu | F24F 3/1417 62/89 |
| 2015/0101355 A1* | 4/2015 | Oh | H01M 10/625 62/3.3 |
| 2015/0253822 A1* | 9/2015 | Degner | G06F 1/20 361/679.47 |
| 2016/0165752 A1* | 6/2016 | Pietrantonio | H05K 7/20927 165/121 |
| 2016/0327287 A1* | 11/2016 | Sprayberry | F24F 3/0442 |
| 2016/0381826 A1* | 12/2016 | Barbato | F24F 11/30 62/91 |
| 2017/0021698 A1* | 1/2017 | Hatakeyama | F25B 7/00 |
| 2017/0063260 A1* | 3/2017 | Li | H02P 5/74 |
| 2017/0081040 A1* | 3/2017 | Pal | B64D 37/34 |
| 2017/0094841 A1* | 3/2017 | Towner | F24F 6/02 |
| 2017/0113225 A1* | 4/2017 | Howell | B01L 7/52 |
| 2017/0370625 A1* | 12/2017 | Hirshberg | H01L 35/30 |
| 2018/0286781 A1* | 10/2018 | Yoshihara | B60K 11/02 |
| 2018/0324981 A1* | 11/2018 | Murakami | H05K 7/20445 |

OTHER PUBLICATIONS

Remeli, M.F., et al., "Power generation from waste heat using Heat Pipe and Thermoelectric Generator", ScienceDirect, Energy Procedia 75 (2015), pp. 645-650.

LeBlanc, Saniya, "Thermoelectric generators: Linking material properties and systems engineering for waste heat recovery applications", Sustainable Materials and Technologies 1-2 (2014), pp. 26-35.

Remeli, M.F., et al., "Passive Heat Recovery System using Combination of Heat Pipe and Thermoelectric Generator", ScienceDirect, Energy Procedia 75 (2015), pp. 608-614.

* cited by examiner

ELECTRICAL MODULE COOLING THROUGH WASTE HEAT RECOVERY

FIELD OF THE INVENTION

The invention relates to electronics cooling generally and, more particularly, to a method and/or apparatus for implementing electrical module cooling through waste heat recovery.

BACKGROUND

Conventional electronic control units in motor vehicles generate a considerable amount of waste heat. Cooling fans or liquid cooling systems are typically used to cool the electronic control units in production vehicles. However, the cooling fans can be loud. Noise control logic is used to run the cooling fans in conjunction with other high noise systems to mask the cooling fans from occupant perception. Such control logic limits the cooling performance of the cooling fan based on the ambient background noise rather than the cooling demands. Similarly, liquid cooling systems add complexity to the vehicles with hoses, fittings, pumps and radiators.

It would be desirable to implement electrical module cooling through waste heat recovery.

SUMMARY

The invention concerns an apparatus including a base, one or more first fins, one or more second fins and one or more thermoelectric generation units. The base may be thermally couplable to an electrical module that generates heat while operational. The first fins may be thermally connected to the base. The second fins may be thermally isolated from the base. The thermoelectric generation units may be (i) disposed between the first fins and the second fins and (ii) configured to convert a heat difference between the first fins and the second fins into an electrical signal at a port thereby cooling the electrical module.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing electrical module cooling through waste heat recovery that may (i) convert waste heat power into electrical power, (ii) help cool electronic control units, (iii) provide supplemental electrical power in electric, hybrid and/or internal combustion vehicles, (iv) avoid inefficient cooling and/or (v) be implemented with solid-state devices.

Various embodiments of the invention generally apply a principle of solid state waste heat recovery to electronic control units (ECUs) to achieve a cooling effect, to generate electrical power and/or provide a heating source inside a passenger vehicle. The techniques implemented by the invention may reduce an overall electrical load to some percentage of the expected wattage (e.g., approximately 40 watts to 60 watts) per processor, electrical module or device. Conversion of waste heat back into electricity may reduce the electrical load (e.g., reduce to an effective 20 to 30 watts per processor) from an electrical bus load perspective.

In various embodiments, a high-heat-side (e.g., heat source side) metal material (e.g., plating) may be located near and/or bonded (e.g., with thermal paste/pad) to each electronic control unit. A low-heat-side (e.g., heat sink side) metal material may be oriented outward away from the electronic control unit. In some embodiments, the low-heat-side metal may be integrated into a housing of the electronic control unit, with a part of the housing being composed of the low-heat-side metal. Cooling fins may be included to increase a thermal differential between the high-heat-side and the low-heat-side, thereby increasing the cooling and the power recovery. In some designs, both the high-heat side material and the low-heat material may be attached to a portion of the housing.

Figure 1:
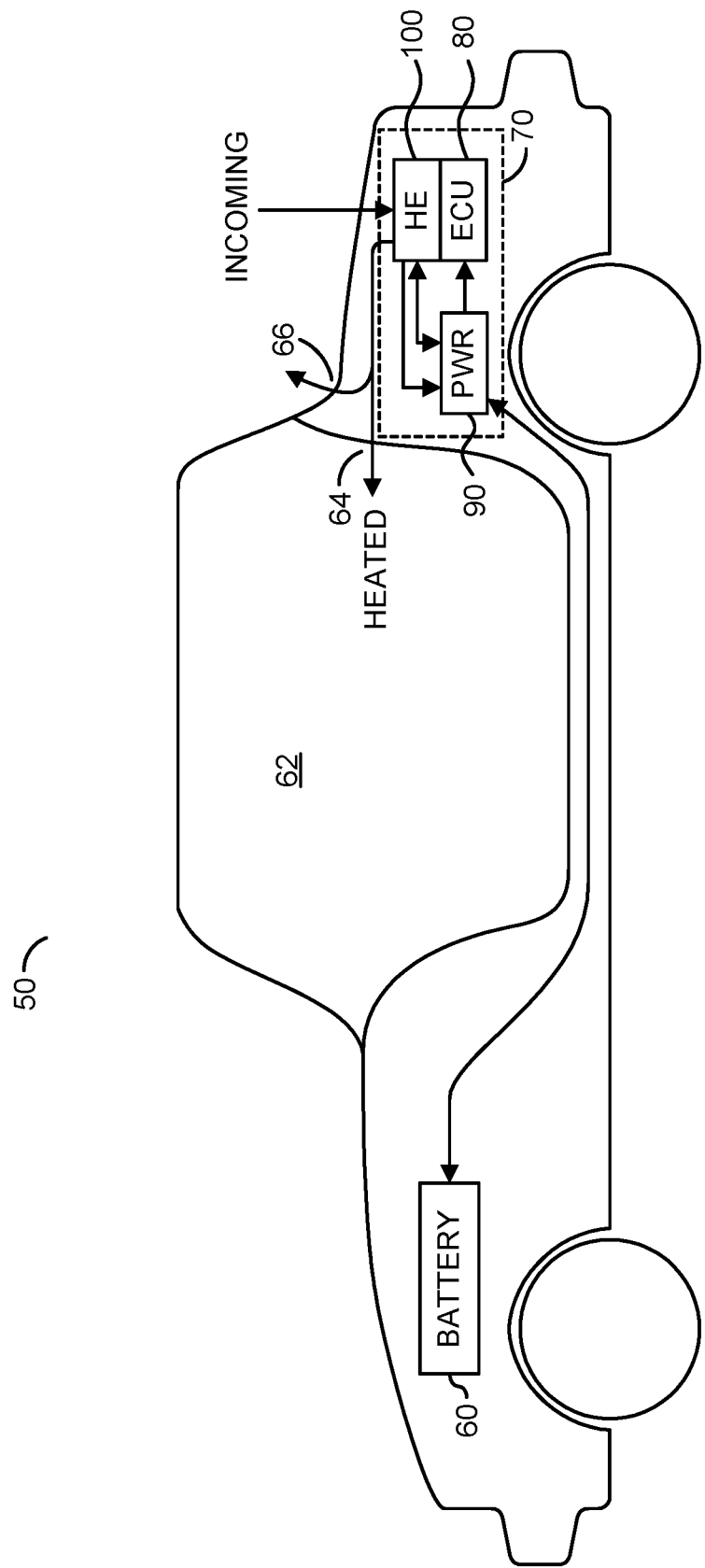
FIG. 1 is a block diagram of a vehicle.

Referring to FIG. 1, a block diagram of an example implementation of a vehicle 50 is shown. The vehicle 50 may implement a passenger and/or freight carrying vehicle. In various embodiments, the vehicle 50 may be an all-electric vehicle, a hybrid vehicle, an internal combustion engine vehicle or any other type of motor vehicle.

The motor vehicle 50 generally comprises a block (or circuit) 60, a compartment (or space) 62, a vent (or port) 64, a vent (or port) 66 and a block (or circuit) 70. The circuit 70 generally comprises one or more blocks (or circuits, one shown) 80, a block (or circuit) 90 and one or more blocks (or circuits, one shown) 100. An air or gas stream (e.g., INCOMING) may be received by the circuit 100. An air or gas stream (e.g., HEATED) may be generated by the circuit 100 and presented to the port 64 and/or the port 66.

The circuit 60 may implement a battery. In various embodiments, the battery 60 may implement a lighting and ignition battery. The battery 60 may be operational to provide (e.g., discharge) low voltage (e.g., 12 volts DC) electrical power inside the motor vehicle 50 and to the circuit 70. The battery 60 may also be operational to receive electrical power from the circuit 70 (e.g., recharge the battery 60).

The compartment 62 may implement a passenger compartment. The passenger compartment 62 may be configured to receive the stream HEATED from the circuit 70 via the port 64. Where the stream HEATED is heated air, the air may be vented directly into the passenger compartment. Where the stream HEATED is a liquid, a heat exchanger may be included to transfer the heat energy from the liquid to the air inside the passenger compartment 62.

The port 64 may implement an open/closed port. The port 64 may be in an open state (or mode) to allow the stream HEATED into the passenger compartment 62. The port 64 may be a closed state (or mode) to block the stream HEATED from the passenger compartment. In some embodiments, the port 64 may include a variable degree of openness to permit variable reduced amounts of the stream HEATED to pass into the passenger compartment 62.

The port 66 may implement an open/closed port. The port 66 may be in an open state (or mode) to allow the stream HEATED to vent external to the motor vehicle 50. The port 66 may be a closed state (or mode) to keep the stream HEATED inside the motor vehicle 50. In some embodiments, the port 66 may include a variable degree of openness to permit variable reduced amounts of the stream HEATED to pass external to the motor vehicle 50.

The circuit 70 may implement an electronics apparatus (or system or circuit). The electronics apparatus 70 is generally operational to provide processing resources for the motor vehicle 50. In various embodiments, the processing resources may include, but are not limited to, autonomous driving and assisted driving functions such as parking assistance, parking visualization, automated parking, backup assistance, object detection and lane keeping. In various embodiments, the processing resources may also include multi-media processing and navigation system processing. Other processing functions may be implemented to meet the design criteria of a particular application. The electronics apparatus 70 generally consumes electrical power from the battery 60. In return, the electronics apparatus 70 may generate waste heat converted into the stream HEATED and/or additional electrical power. The additional electrical power may be consumed internally to the electronics apparatus 70, used by other electrical loads within the vehicle 50 (e.g., fans, seat heaters, steering wheel heaters, interior lights and the like) and/or used to recharge the battery 60.

The circuit 80 may implement one or more electronic control units (ECU). Each electronic control unit 80 may be operational to provide the processing resources of the electronics apparatus 70. In some embodiments, a single electronic control unit 80 may be implemented. In other embodiments, multiple electronic control units 80 may be implemented. The electronic control units 80 may be configured as an autonomous driving circuit.

The circuit 90 may implement an electrical power switching circuit. The power switching circuit 90 is generally operational to switch electrical power among the power sources (e.g., the battery 60 and the circuit 100) and the power loads (e.g., the electronic control unit 80 and the circuit 100).

The circuit 100 may implement one or more heat exchange units. Each heat exchange unit 100 is generally operational to cool the electronic control unit 80. Each heat exchange unit 100 may also be operational to convert waste heat generated by the electronic control unit 80 into electrical power. The heat exchange units 100 may also exchange some heat generated by the electronic control unit with the stream INCOMING to generate the stream HEATED. Any additional heat generated by the electronic control unit 80 not converted into electrical power and the stream HEATED may be dissipated into the air inside the motor vehicle 50 (e.g., inside a trunk of the motor vehicle 50).

Figure 2:
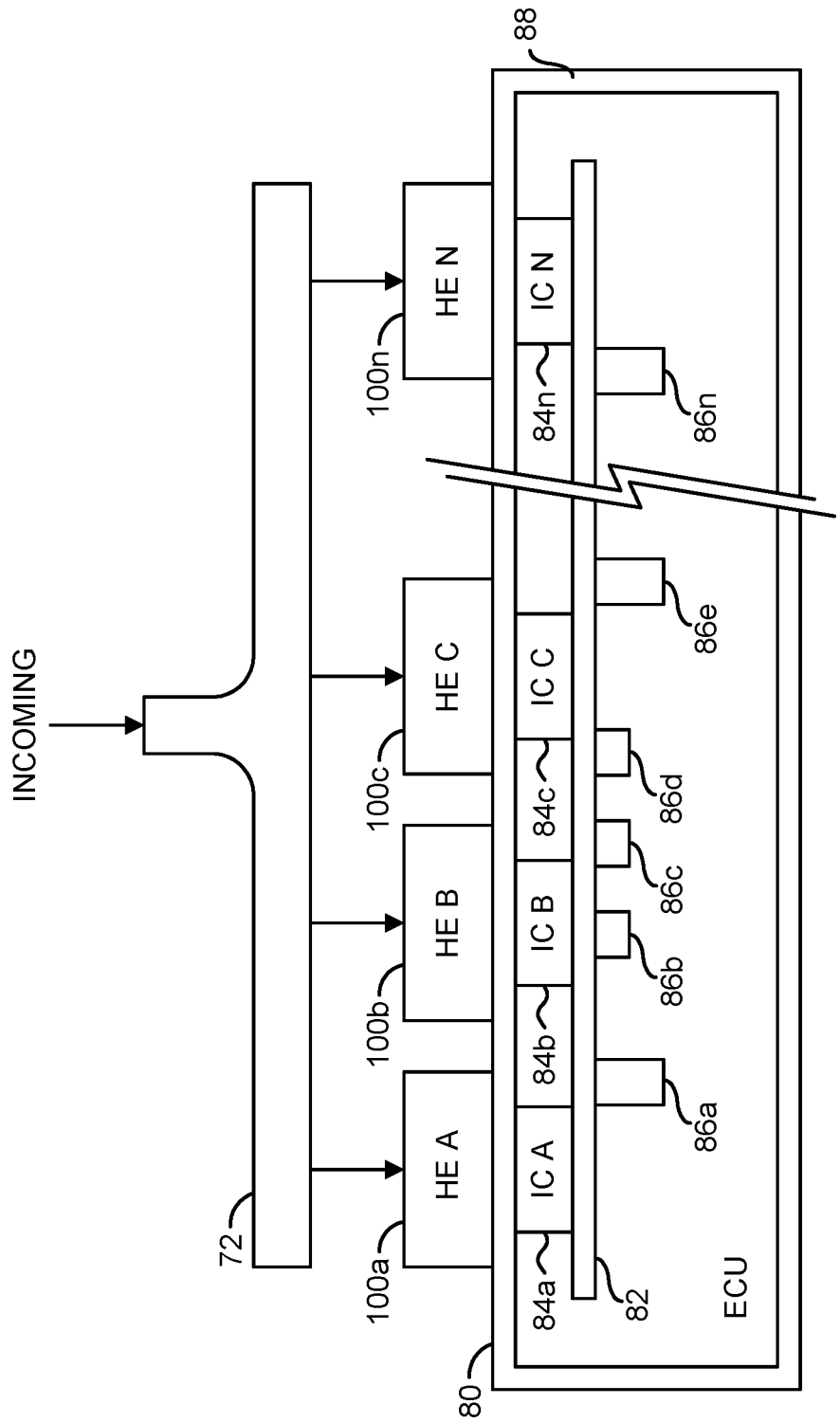
FIG. 2 is a block diagram of a portion of an electronics apparatus within the vehicle.

Referring to FIG. 2, a block diagram of a portion of the electronics apparatus 70 is shown. The electronics apparatus 70 may further comprise a manifold 72 and multiple heat exchange units 100a-100n. The electronic control unit 80 generally comprises a block (or circuit) 82, one or more blocks (or circuits) 84a-84n and multiple blocks (or circuits) 86a-86n and a housing 88.

The manifold 72 may implement a pneumatic manifold or a liquid manifold. Where the stream INCOMING is a gas (e.g., air), the manifold 72 may direct the incoming air onto all of the heat exchange units 100a-100n. Where the stream INCOMING is a cooling liquid (e.g., from an electrical drive of the motor vehicle 50), the liquid manifold (or cooling lines) 72 may direct the incoming cooling fluid onto and away from all of the heat exchange units 100a-100n.

The circuit 82 may implement a printed circuit board. The printed circuit board 82 is generally operational to support and interconnect all of the electronics components that provide the processing resources of the electronic control unit 80. In various embodiments, the printed circuit board 82 may have components mounted on both sides. In some embodiments, the printed circuit board 82 may have components mounted on a single side.

The circuits 84a-84n may implement integrated circuits (IC). The integrated circuits 84a-84n may typically be implemented as processors, electrical modules and/or similar devices. The integrated circuits 84a-84n may be operational to provide various electronic functions in the electronic control unit 80. The functions may include, but are not limited to, autonomous driving functions and assisted driving functions such as parking assistance, backup assistance and object detection. In typical embodiments, the integrated circuits 84a-84n may be mounted on the printed circuit board 82 on a same side as the heat exchange units 100a-100n. The integrated circuits 84a-84n may also be mounted in direct physical and thermal contact with the housing 88 of the electronic control unit 80 for good heat transfer to the heat exchange units 100a-100n. In some situations, the housing 88 may be thinned where the integrated circuits 84a-84n are located to provide better heat transfer to the nearest heat exchange units 100a-100n.

The circuits 86a-86n may implement various electrical components. The components 86a-86n are generally operational to provide support for the integrated circuits 84a-84n. The components 86a-86n may include, but are not limited to, resistors, capacitors, inductors, transistors, diodes, passive electrical device and active electrical devices. In various embodiments, the components 86a-86n may be mounted on a side of the printed circuit board 82 away from the heat exchange units 100a-100n.

The heat exchange units 100a-100n may be physically and thermally connected to the housing 88 of the electronic control unit 80. A heat transfer capacity of each heat exchange unit 100a-100n may be approximately 50 watts of heat while the air stream INCOMING is flowing. In some embodiments, a single heat exchange unit (e.g., 100a) may be sufficient to cool the integrated circuits 84a-84n of the electronic control unit 80. In other embodiments, multiple heat exchange units 100a-100n may be implemented to cool the electronic control unit 80. For example, each integrated circuit 84a-84n may have a corresponding heat exchange unit 100a-100n. Other numbers and/or ratios of heat exchange units 100a-100n to integrated circuits 84a-84n may be implemented to meet the design criteria of a particular application.

Figure 3:
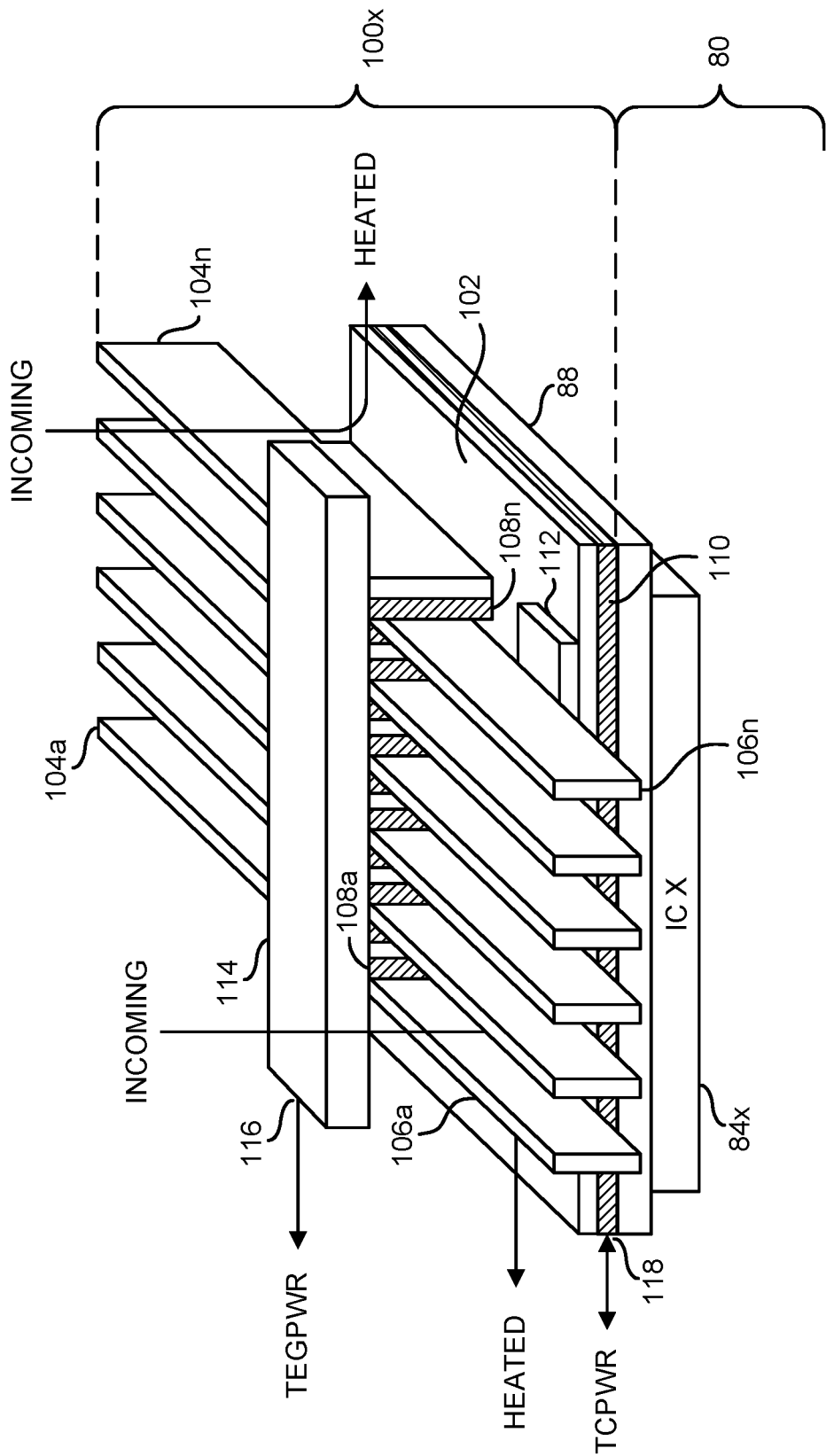
FIG. 3 is a perspective diagram of a heat exchange unit in accordance with an embodiment of the invention.

Referring to FIG. 3, a perspective diagram of an example implementation of a heat exchange unit 100x is shown in accordance with an embodiment of the invention. The heat exchange unit 100x illustrated may be representative of each heat exchange unit 100a-100n. The heat exchange unit 100x generally comprises a base (or block) 102, multiple fins (or vanes) 104a-104n, multiple fins (or vanes) 106a-106n, multiple blocks (or circuits) 108a-108n, a block (or circuit) 110, a support (or spacer) 112, a block (or circuit) 114, a port (or interface) 116 and a port (or interface) 118. A signal (e.g., TEGPWR) may be generated by the circuit 114 and received by the power switching circuit 90 (FIG. 1). The signal TEGPWR may convey an electrical power created by the circuits 108a-108n. A signal (e.g., TCPWR) may be exchanged between the circuit 110 and the power switching circuit 90 (FIG. 1). The signal TCPWR may be a bidirectional signal used to carry power to the circuit 110 when in a heating mode and carry power away from the circuit 110 when in a cooling mode.

The base 102 may be implemented as a thermally conductive (e.g., metal) plate. The base 102 is generally operational to provide mechanical support for the heat exchange unit 100x and provide a highly conductive thermal path for the heat generated by the integrated circuit 84x.

The fins 104a-104n may implement cooling fins on a hot side (e.g., hot fins) of the circuits 108a-108n. The hot fins 104a-104n are generally operational to carry heat away from the base 102 and the integrated circuit 84x. The heat may be dissipated into the circuits 108a-108n and/or the stream INCOMING. The hot fins 104a-104n are generally oriented perpendicular to a side of the housing 88 that connects to the base 102.

The fins 106a-106n may implement cooling fins on a cold side (e.g., cold fins) of the circuits 108a-108n. The cold fins 106a-106n are generally operational to keep the cold side of the circuits 108a-108n at or near (e.g., slightly above) the ambient temperature of the stream INCOMING. A temperature difference from the hot fins 104a-104n to the cold fins 106a-106n may enable the circuits 108a-108n to generate electrical power. The cold fins 106a-106n are generally oriented perpendicular to a side of the housing 88 that connects to the base 102.

The circuits 108a-108n may implement thermoelectric generator (TEG) units. Each thermoelectric generator unit 108a-108n is generally operational to convert a heat difference from the hot side (e.g., the hot fins 104a-104n) to the cold side (e.g., the cold fins 106a-106n) into an electrical signal. A combination of the electrical signals generated by the thermoelectric generator units 108a-108n may be the signal TEGPWR. In various embodiments, each thermoelectric generator unit 108a-108n may be implemented as a solid-state device that operates per the common Seebeck effect. Semiconductors used in the thermoelectric generator units 108a-108n may include, but are not limited to, bismuth telluride ($Bi_2Te_3$), lead telluride (PbTe), calcium manganese oxide ($Ca_2Mn_3O_8$), or combinations of the materials. Other semiconductors may be implemented to meet the design criteria of a particular application.

A thermal pathway from the integrated circuit 84x through the base 102 and the hot fins 104a-104n may be configured to limit an upper junction temperature of the integrated circuit 84x to no more than 125 degrees Celsius (257 degrees Fahrenheit). Consider a case where the stream INCOMING is ambient air with a maximum temperature of approximately 60 degrees Celsius (140 degrees Fahrenheit). Allowing for a 20-degree Celsius drop from the junctions of the integrated circuit 84x to the housing 88 (e.g., a maximum housing temperature of 105 degrees Celsius), another 2-degree Celsius drop from the housing 88 to the part of the hot fins 104a-104n in contact with the thermoelectric generator units 108a-108n, and a 5-degree Celsius drop between the hottest ambient air and each of the hot fins 104a-104n and the cold fins 106a-106n, the thermoelectric generator units 108a-108n may experience an approximately 33-degree Celsius heat difference (or gradient) from the hot side (e.g., 125−20−2−5=98°) to the cold side (e.g., 60+5=65°). Utilizing pre-cooled air as the stream INCOMING or using a cooling fluid as the stream INCOMING generally results in a greater heat gradient across the thermoelectric generation units 108a-108n and provides for a greater heat transfer away from the electronic control unit 80 and therefore greater cooling.

The circuit 110 may implement a thermocouple. The thermocouple 110 is generally disposed between the base 102 and the housing 88 of the electronic control unit 80. In some embodiments, the thermocouple 110 may be considered as part of the heat exchange unit 100x (as shown). In other embodiments, the thermocouple 110 may be considered as part of the electronic control unit 80. The thermocouple 110 may be configured to send/receive the signal TCPWR through the port 118. In a heating mode, electrical power may be applied in the signal TCPWR at the port 118 by the power switching circuit 90 to cause the thermocouple 110 to provide heat the housing 88 side relative to the base 102 side. In doing so, the thermocouple 110 may generate a warming heat used to warm the integrated circuit 84x during a cold start. In a cooling mode, the thermocouple 110 may generate electrical power from the heat difference between the integrated circuit 84x and the base 102. The generated power may be presented at the port 118 in the signal TCPWR back to the power switching circuit 90.

The support 112 may implement a thermal insulating support. The support (or insulator) 112 is generally operational to provide mechanical support for the cold fins 106a-106n. The support 112 may also provide thermal isolation between the heat in the base 102 and the cold fins 106a-106n. The thermal isolation generally helps keep the cold fins 106a-106n at or near the temperature of the stream INCOMING to help maintain as high as possible thermal gradient across the thermoelectric generation units 108a-108n.

The circuit 114 may implement a connector. The connector 114 is generally operational to electrically connect all of the thermoelectric generation units 108a-108n to the port 116 and the signal TEGPWR. In various embodiments, the connector 114 may interconnect some or all of the thermoelectric generator units 108a-108n in series to increase the resulting voltage available in the signal TEGPWR. In some embodiments, the connector 114 may interconnect some or all of the thermoelectric generator units 108a-108n in parallel to increase the resulting current available in the signal TEGPWR. In still other embodiments, the connector 114 may connect some of the thermoelectric generator units 108a-108n in parallel and other units in series.

Figure 4:
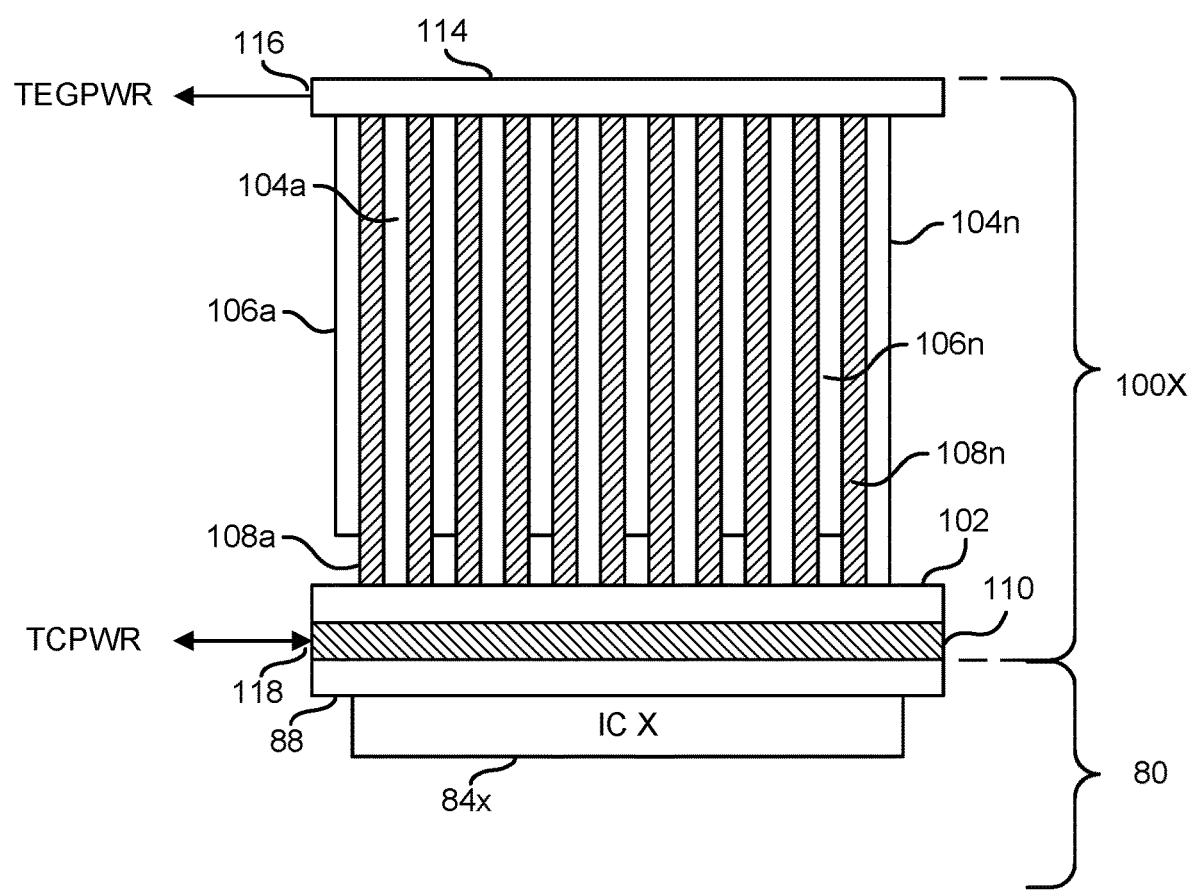
FIG. 4 is a block diagram of a cross-sectional view of the heat exchange unit in FIG. 3.

Referring to FIG. 4, a block diagram of an example cross-sectional view of the heat exchange unit 100x is shown. As illustrated, the hot fins 104a-104n may be in direct physical and thermal contact with the base 102 for efficient heat transfer. The cold fins 106a-106n may be slightly removed from the base 102 to avoid unwanted heating from the base 102. The thermoelectric generator units 108a-108n may be disposed between each pair of hot fins 104a-104b and cold fins 106a-106n. Each thermoelectric generator unit 108a-108n may also be in direct physical and thermal contact with the base 102.

Figure 5:
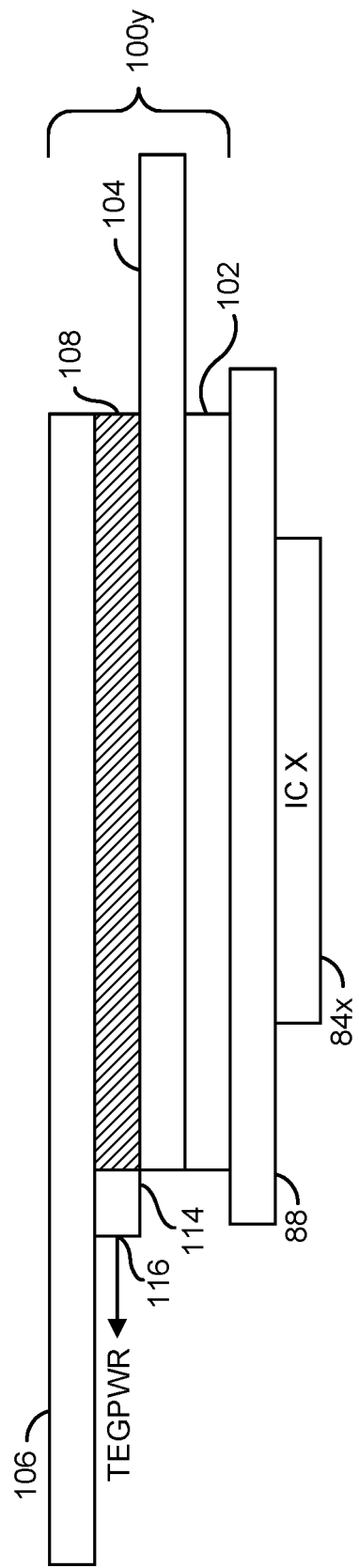
FIG. 5 is a block diagram of a cross-sectional view of another heat exchange unit.

Referring to FIG. 5, a block diagram of an example cross-sectional view of another heat exchange unit 100y is shown. The heat exchange unit 100y illustrated may be representative of each heat exchange unit 100a-100n. The heat exchange unit 100y may be a variation of the heat exchange unit 100x with the fins oriented parallel to the housing 88. The heat exchange unit 100y generally comprises the base 102, a hot fin (or vane) 104, a cold fin (or vane) 106, a thermoelectric generator unit 108 and the connector 114. The base 102 may be in direct physical and thermal contact with the housing 88 proximate the integrated circuit 84x. The hot fin 104 and the cold fin 106 are generally oriented parallel to a side of the housing 88 that connects to the base 102. The signal TEGPWR may be generated by the circuit 108, transferred to the connector 114 and received by the power switching circuit 90 (FIG. 1). In some embodiments, the thermocouple 110 may be included between the base 102 and the housing 88, similar to FIG. 4.

Heat generated by the integrated circuit 84x may heat the hot fin 104. The hot fin 104 subsequently dissipates any excess heat into the surrounding environment. The hot fin 104 generally heats a side of the thermoelectric generator unit 108. An opposite side of the thermoelectric generator unit 108 is cooled by the cold fin 106. The resulting temperature gradient across the thermoelectric generator unit 108 generates electrical power in the signal TEGPWR.

Figure 6:
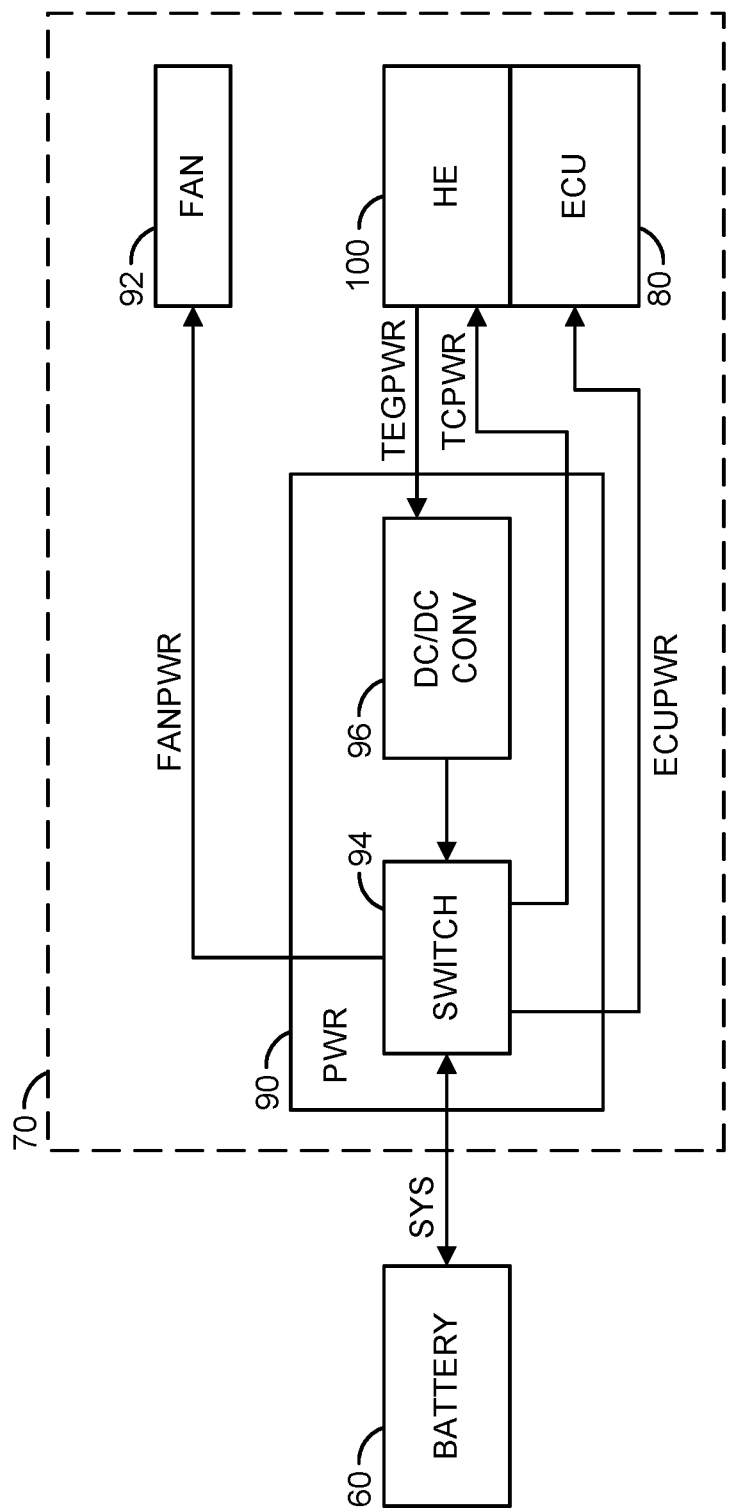
FIG. 6 is a detailed block diagram of the electronics apparatus.

Referring to FIG. 6, a detailed block diagram of an example implementation of the electronics apparatus 70 is shown. In addition to the electronic control unit 80, the power switching circuit 90 and the heat exchange unit 100, the electronics apparatus 70 may include a fan (or pump) 92. The power switching circuit 90 generally comprises a block (or circuit) 94 and a block (or circuit) 96.

The signal TEGPWR may be generated by the heat exchange unit 100 and presented to the circuit 96. The signal TCPWR may be exchanged between the heat exchange unit 100 and the circuit 94. A signal (e.g., FANPWR) may be generated by the circuit 94 and presented to the fan 92. A signal (e.g., ECUPWR) may be generated by the circuit 94 and transferred to the electronics control unit 80. The signal ECUPWR may provide electrical power to operate the circuitry inside the electronics control unit 80. A signal (e.g., SYS) may be exchanged between the battery 60 and the circuit 94. The signal SYS may carry a system voltage of the vehicle 50.

The fan 72 may be operational to force air/cooling fluid in the stream INCOMING to the heat exchange unit 100. Control of the fan (e.g., on/off and speed) may be provided by the signal FANPWR generated by the power switching circuit 90. In some embodiments, the fan 72 may be eliminated where the cooling capacity of the heat exchange unit 100 is sufficient in the surrounding ambient air.

The circuit 94 may implement a switch circuit. The switch circuit 94 is generally operational to switch electrical power among the battery 60, the electronic control unit 80, the fan 92 and the heat exchange unit 100. In particular, the switch circuit 94 may switch the signal TCPWR between sending power to the thermocouple 110 while in the heating mode and receiving power from the thermocouple 110 while in the cooling mode.

The circuit 96 may implement a DC-to-DC converter circuit. The DC-to-DC converter circuit 96 may be operational to increase the voltage received from the thermoelectric generator units 108a-108n to a voltage compatible with the system voltage of the battery 60 (e.g., 12 to 15 volts) in the signal SYS. The output signal generated by the DC-to-DC converter circuit 96 may be provided to the switch circuit 94 for routing to the battery 60, the fan 92 and/or the electronic control unit 80.

Figure 7:
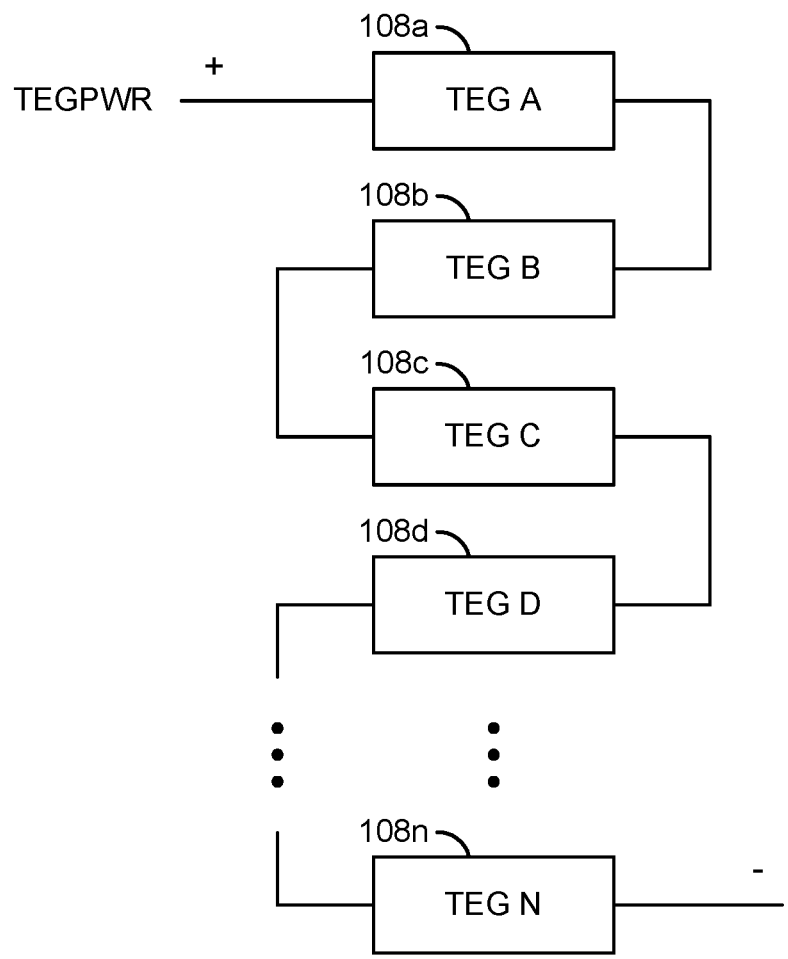
FIG. 7 is a block diagram of a series interconnect of thermoelectric generator units.

Referring to FIG. 7, a block diagram of an example implementation of a series interconnect of the thermoelectric generator units 108a-108n is shown. In some embodiments, each unit cell of the thermoelectric generator units 108a-108n may generate tens of microvolts to hundreds of microvolts per degree of temperature difference, depending on the solid-state materials. By connecting the unit cells in series within each thermoelectric generator unit 108a-108n, several tenths of a voltage may be created by each unit 108a-108n. To increase the generated voltages to a higher level, some or all (as shown) of the thermoelectric generator units 108a-108n may be interconnected in series. The combined series voltage may be presented in the signal TEGPWR to the DC-to-DC converter circuit 96 or, if sufficiently high, to the switch circuit 94.

Figure 8:
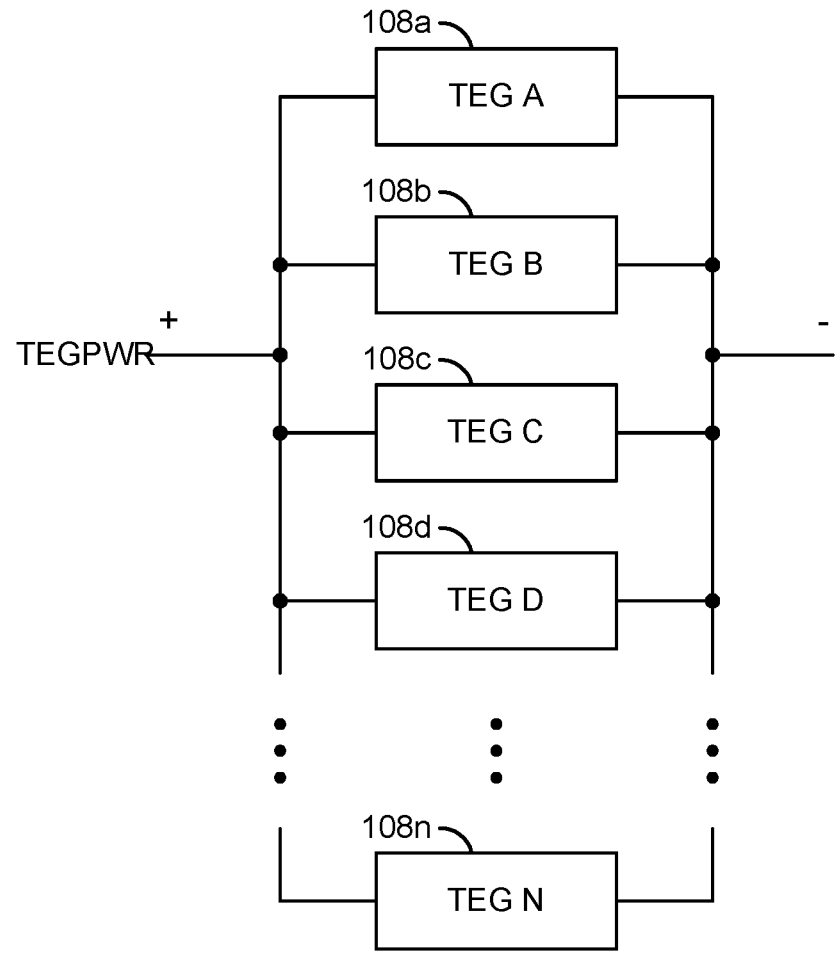
FIG. 8 is a block diagram of a parallel interconnect of the thermoelectric generator units.

Referring to FIG. 8, a block diagram of an example implementation of a parallel interconnect of the thermoelectric generator units 108a-108n is shown. In some embodiments, the voltage generated by the individual thermoelectric generator units 108a-108n may be sufficient for use by the DC-to-DC converter and/or the switch circuit 94. In such cases, the individual thermoelectric generator units 108a-108n may be interconnected in parallel to increase the total amount of current produced at the generated voltage. The resulting electrical power may be presented in the signal TEGPWR to the DC-to-DC converter circuit 96 and/or the switch circuit 94.

The functions and structures illustrated in the diagrams of FIGS. 1-8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), SoCs (system-on-chips), MCM (multi-chip module), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a base having a first side thermally couplable to an exterior surface of an electrical module that generates heat while operational;
one or more first fins located outside of said electrical module and thermally connected to and in direct physical contact with a second side of said base, said second side opposite said first side of said base;
one or more second fins interleaved with said one or more first fins and thermally isolated from said base; and
one or more thermoelectric generation units disposed within spaces between said first fins and said second fins, each (i) thermally connected to and in direct physical contact with a respective one of said first fins and a respective one of said second fins and (ii) configured to convert a heat difference between said respective first fin and said respective second fin into an electrical signal at a port, thereby cooling said electrical module.

2. The apparatus according to claim 1, further comprising a thermocouple (i) thermally connected to said first side of said base and said exterior surface of said electrical module, and (ii) configured to generate an additional electrical signal at an additional port in response to said heat generated by said electrical module.

3. The apparatus according to claim 2, wherein said thermocouple is further configured to generate heat to warm said electrical module in response to a current being applied to said additional port.

4. The apparatus according to claim 1, further comprising an insulator configured to secure said second fins to said second side of said base, wherein said thermoelectric generator units are thermally connected to and in direct physical contact with said second side of said base.

5. The apparatus according to claim 1, further comprising a connector configured to (i) connect to each of said thermoelectric generator units and (ii) present said electrical signal at said port.

6. The apparatus according to claim 1, wherein each of said thermoelectric generator units is configured to generate a voltage and a current in response to said heat difference between said first fins and said second fins.

7. The apparatus according to claim 6, wherein a plurality of said thermoelectric generator units are connected in series such that said electrical signal at said port has a higher voltage than said voltage generated by each individual one of said thermoelectric generator units.

8. The apparatus according to claim 6, wherein a plurality of said thermoelectric generator units are connected in parallel such that said electrical signal at said port has a higher current than said current generated by each individual one of said thermoelectric generator units.

9. The apparatus according to claim 1, wherein said first fins are configured to dissipate at least 50 watts of heat.

10. The apparatus according to claim 1, wherein said first fins and said second fins are oriented perpendicular to said exterior surface of said electrical module that is coupled to said first side of said base.

11. An apparatus comprising:
an electronic control unit comprising one or more electrical modules that generate heat while operational;
one or more heat exchange units, each comprising a base having a first side thermally connected to and physically bonded directly to an exterior surface of said electronic control unit, one or more first fins thermally connected to and in direct physical contact with a second side of said base that is opposite of said first side, one or more second fins aligned with said one or more first fins and thermally isolated from said base, and one or more thermoelectric generation units disposed between said first fins and said second fins, each (i) thermally connected to and in direct physical contact with a respective one of said first fins and a respective one of said second fins, and (ii) configured to convert a heat difference between said respective first fin and said respective second fin into an electrical signal at a port, thereby cooling said electrical modules; and
a switching circuit configured to convert said electrical signal created by said heat exchange units to a system voltage of a battery used in a motor vehicle.

12. The apparatus according to claim 11, wherein each of said heat exchange units further comprises a thermocouple (i) thermally connected and physically bonded to said first side of said base and said exterior surface of said electronic control unit and (ii) configured to generate an additional electrical signal at an additional port in response to said heat.

13. The apparatus according to claim 12, wherein said thermocouples are further configured to warm said electrical modules in response to a current applied to said additional port by said switching circuit.

14. The apparatus according to claim 12, wherein said switching circuit is further configured to convert said additional electrical signal to said system voltage.

15. The apparatus according to claim 11, further comprising a fan (i) powered by said switching circuit and (ii) configured to direct incoming air to said heat exchange units.

16. The apparatus according to claim 15, wherein said heat exchange units are further configured to generate heated air by heating said incoming air, the apparatus further comprising a duct configured to direct said heated air into a passenger compartment of said motor vehicle.

17. The apparatus according to claim 11, further comprising one or more cooling lines configured to direct cooling fluid to said heat exchange units, wherein said cooling fluid carries heat away from said heat exchange units.

18. The apparatus according to claim 11, wherein said electronic control unit comprises an autonomous driving circuit of said motor vehicle.

19. The apparatus according to claim 11, wherein said first fins and said second fins are oriented parallel to said exterior surface of said electronic control unit connected to said base.

20. The apparatus according to claim 11, wherein said switching circuit is further configured to connect two or more of said heat exchange units either (i) in series such that said electrical signal at said port has a higher voltage than a respective voltage generated by each individual one of said heat exchange units or (ii) in parallel such that said electrical signal at said port has a higher current than a respective current generated by each individual one of said heat exchange units.

* * * * *